United States Patent
Elkanovich et al.

(10) Patent No.: US 11,687,472 B2
(45) Date of Patent: Jun. 27, 2023

(54) INTERFACE FOR SEMICONDUCTOR DEVICE AND INTERFACING METHOD THEREOF

(71) Applicants: Global Unichip Corporation, Hsinchu (TW); Taiwan Semiconductor Manufacturing Co., Ltd., Hsinchu (TW)

(72) Inventors: Igor Elkanovich, Hsinchu (TW); Amnon Parnass, Hsinchu (TW); Pei Yu, Hsinchu (TW); Li-Ken Yeh, Hsinchu (TW); Yung-Sheng Fang, Hsinchu (TW); Sheng-Wei Lin, Hsinchu (TW); Tze-Chiang Huang, Hsinchu (TW); King Ho Tam, Hsinchu (TW); Ching-Fang Chen, Hsinchu (TW)

(73) Assignees: GLOBAL UNICHIP CORPORATION, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 440 days.

(21) Appl. No.: 16/999,055

(22) Filed: Aug. 20, 2020

(65) Prior Publication Data
US 2022/0058144 A1 Feb. 24, 2022

(51) Int. Cl.
*G06F 13/16* (2006.01)
*H01L 25/065* (2023.01)
(Continued)

(52) U.S. Cl.
CPC ......... *G06F 13/1689* (2013.01); *H01L 24/06* (2013.01); *H01L 24/17* (2013.01);
(Continued)

(58) Field of Classification Search
CPC ..... G06F 13/1689; H01L 24/06; H01L 24/17; H01L 25/0657; H01L 24/73;
(Continued)

(56) References Cited

U.S. PATENT DOCUMENTS

| 6,049,894 A | 4/2000 | Gates |
| 8,743,582 B2 | 6/2014 | Kang et al. |

(Continued)

FOREIGN PATENT DOCUMENTS

| TW | 201225542 | 6/2012 |
| TW | 201717006 | 5/2017 |
| TW | 201830394 | 8/2018 |

OTHER PUBLICATIONS

Office Action of Taiwan Counterpart Application, dated May 4, 2021, pp. 1-4.

(Continued)

*Primary Examiner* — Henry Tsai
*Assistant Examiner* — Aurangzeb Hassan
(74) *Attorney, Agent, or Firm* — JCIPRNET

(57) ABSTRACT

An interface for a semiconductor device is provided. The semiconductor device has a master device and multiple slave devices as stacked up with electric connection. The interface includes a master interface, implemented in the master device and including a master interface circuit with a master bond pattern. Further, a slave interface is implemented in each slave device and includes a slave interface circuit with a slave bond pattern to correspondingly connect to the master bond pattern. A clock route is to transmit a clock signal through the master interface and the slave interface. The master device transmits a command and a selecting slave identification through the master interface to all the slave interfaces. One of the slave devices corresponding to the selecting slave identification executes the command and (Continued)

responds a result back to the master device through the slave interfaces and the master interface.

22 Claims, 12 Drawing Sheets

(51) Int. Cl.
*H01L 23/00* (2006.01)
*H03K 3/037* (2006.01)
*H03L 7/081* (2006.01)

(52) U.S. Cl.
CPC .......... *H01L 25/0657* (2013.01); *H01L 24/73* (2013.01); *H01L 2224/0401* (2013.01); *H01L 2225/06541* (2013.01); *H01L 2924/1432* (2013.01); *H01L 2924/1436* (2013.01); *H01L 2924/1437* (2013.01); *H03K 3/0372* (2013.01); *H03L 7/081* (2013.01)

(58) Field of Classification Search
CPC ... H01L 2224/0401; H01L 2225/06541; H01L 2924/1432; H01L 2924/1436; H01L 2924/1437; H03K 3/0372; H03L 7/081
See application file for complete search history.

(56) References Cited

U.S. PATENT DOCUMENTS

| | | | |
|---|---|---|---|
| 9,245,827 B2 | 1/2016 | Kang et al. | |
| 9,389,953 B2 | 7/2016 | Choi et al. | |
| 9,530,442 B1 | 12/2016 | Hassner et al. | |
| 10,204,890 B2 * | 2/2019 | Murtuza | H01L 23/49589 |
| 10,592,448 B2 | 3/2020 | Chang | |
| 10,644,826 B2 | 5/2020 | Wuu et al. | |
| 10,969,359 B1 * | 4/2021 | Schindelholz | G01N 27/3275 |
| 2007/0116466 A1 * | 5/2007 | Gewirtzman | H04J 3/1694 |
| | | | 398/71 |
| 2008/0147964 A1 | 6/2008 | Chow et al. | |
| 2012/0199981 A1 * | 8/2012 | Jeong | H01L 25/50 |
| | | | 257/773 |
| 2014/0104935 A1 * | 4/2014 | Ware | G11C 7/106 |
| | | | 365/233.13 |
| 2016/0306382 A1 * | 10/2016 | Amarilio | G06F 13/4291 |
| 2017/0084591 A1 * | 3/2017 | Magnus | H01L 23/3121 |
| 2018/0167095 A1 | 6/2018 | Baringer et al. | |
| 2019/0074268 A1 * | 3/2019 | Murtuza | H01L 21/50 |
| 2019/0213164 A1 | 7/2019 | Kwon et al. | |
| 2019/0341375 A1 * | 11/2019 | Hirano | H01L 24/48 |
| 2019/0347159 A1 | 11/2019 | Chang et al. | |
| 2020/0066692 A1 * | 2/2020 | Wolter | H01L 23/00 |
| 2020/0168527 A1 | 5/2020 | Chang et al. | |
| 2020/0182930 A1 | 6/2020 | Lal et al. | |
| 2020/0365554 A1 * | 11/2020 | Zhang | H01L 25/0652 |
| 2021/0104495 A1 * | 4/2021 | Vodrahalli | H01L 23/562 |

OTHER PUBLICATIONS

"Notice of Allowance of Related U.S. Appl. No. 17/037,739", dated Apr. 5, 2021, pp. 1-11.
"Office Action of Taiwan Related Application, application No. 109142753", dated Mar. 31, 2021, p. 1-p. 4.

* cited by examiner

INTERFACE FOR SEMICONDUCTOR DEVICE AND INTERFACING METHOD THEREOF

BACKGROUND

Technical Field

The invention is related to fabrication of semiconductor device and more particularly to an interface for a semiconductor device and the interfacing method for the semiconductor device.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 3D semiconductor device, in which several circuit chips may be stacked up and integrated as a larger integrated circuit, in which the bonds and the through-silicon via (TSV) are used to connect between the chips.

The packaging technology in system-on-integrated-chips (SoIC) package and wafer-on-wafer (WoW) package, and chip-on-wafer-on-substrate (CoWoS) have been proposed to package multiple chips as stacked up in height.

However, the communication between the master chip and multiple slave chips as the 3D stack is still under development to have better performance with a compact structure.

SUMMARY

The invention provides the interface for a 3D semiconductor device, in which single master chip is stacked with multiple slave chips thereon to form a 3D package structure. The interface allows the communication between the single master chip and the slave chips in an efficient way.

In an embodiment, the invention provides an interface for a semiconductor device. The semiconductor device includes a master device and a plurality of slave devices. The master device and the slave devices are stacked up with electric connection. The interface includes a master interface, a slave interface and a clock route. The master interface is implemented in the master device and including a master interface circuit with a master bond pattern. The slave interface is implemented in each of the slave devices and including a slave interface circuit with a slave bond pattern to correspondingly connect to the master bond pattern. The clock route is to transmit a clock signal through the master interface and the slave interface. The master device transmits a command and a selecting slave identification through the master interface to all the slave interfaces. One of the slave devices corresponding to the selecting slave identification executes the command and responds a result back to the master device through the slave interfaces and the master interface.

In an embodiment, the invention further provides an interfacing method for a semiconductor device. The semiconductor device includes a master device and a plurality of slave devices. The master device and the slave devices are stacked up with electric connection. The interfacing method includes implementing a master interface in the master device, the master interface including a master interface circuit with a master bond pattern. Further, a slave interface is implemented in each of the slave devices, the slave interface including a slave interface circuit with a slave bond pattern to correspondingly connect to the master bond pattern. A clock route is implemented to transmit a clock signal through the master interface and the slave interface. The master device transmits a command and a selecting slave identification through the master interface to all the slave interfaces. One of the slave devices corresponding to the selecting slave identification executes the command and responds a result back to the master device through the slave interfaces and the master interface.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to an interface for a 3D semiconductor device, in which the interface is also fabricated based on the 3D packaging technology. The interface may link single master chip such as processor with multiple slave chips such as static random access memory (SRAM).

In the invention the interface allows the communication between the master chip and the multiple slave chips. The communication signals may include the command from the master chip and the responding information from the one of the slave chips as selected. The interface provides a reliable communication. In addition, the signal latency between the master chip and each of the slave chips may be stable as about a constant and predictable. The due to the control of the latency, the trigger edge of the effective clock may be properly set corresponding to the data packet, which may also be referred as a data eye.

Several embodiments are provided for describing the invention but the invention is not just limited to the embodiments.

Figure 1:
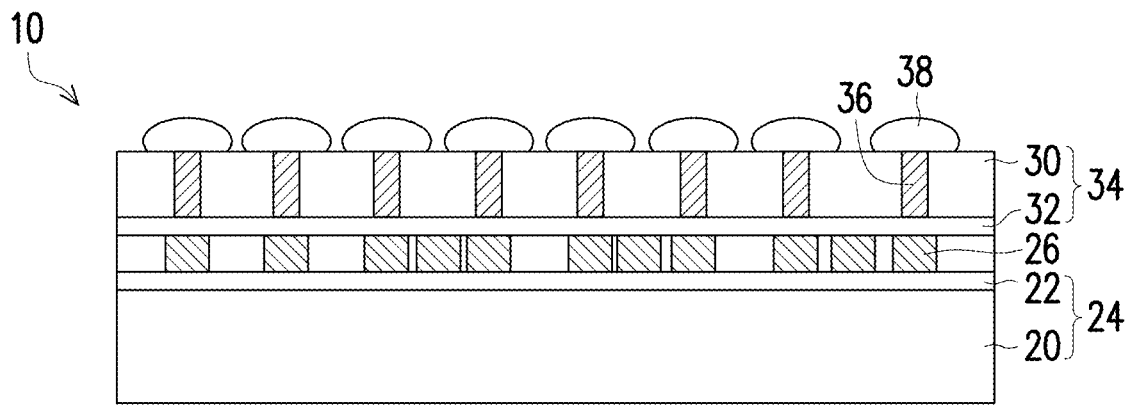
FIG. 1 is a drawing, schematically illustrating a cross-sectional stack structure of 3D semiconductor device, according to an embodiment of the invention.

FIG. 1 is a drawing, schematically illustrating a structure of 3D semiconductor device in cross-sectional view, according to an embodiment of the invention. Referring to FIG. 1, a 3D semiconductor device 10 includes multiple chips 24, 34, which are vertically stacked up in addition to the horizontal distribution of the chips. As a result, the 3D semiconductor device includes the chips is formed.

In an example, a circuit chip 24 may be treated as a master chip, which generally includes the substrate 20 and the circuit layer 22. Several other circuit chips 34, such as serving as the slave chips, are to be stacked over the circuit chip 24, in which the through via structures, such as TSV structure 26 with bonds, based on the packaging process may be formed between the circuit chip 24 and the circuit chips 34. The circuit chip 34 includes the substrate 30 and the circuit layer 32 and may further include the TSV structures 36 at the corresponding locations to electrically connect to the circuit chip 24. In addition, the bonds 38 may also be formed at the most outer surface corresponding to the TSV structures 36.

The 3D packaging technology has been proposed in various stack structure, such as system-on-integrated-chips (SoIC) package, wafer-on-wafer (WoW) package, and chip-on-wafer-on-substrate (CoWoS). The invention is based on the 3D packaging but not limited to the types of the 3D packaging.

Figure 2:
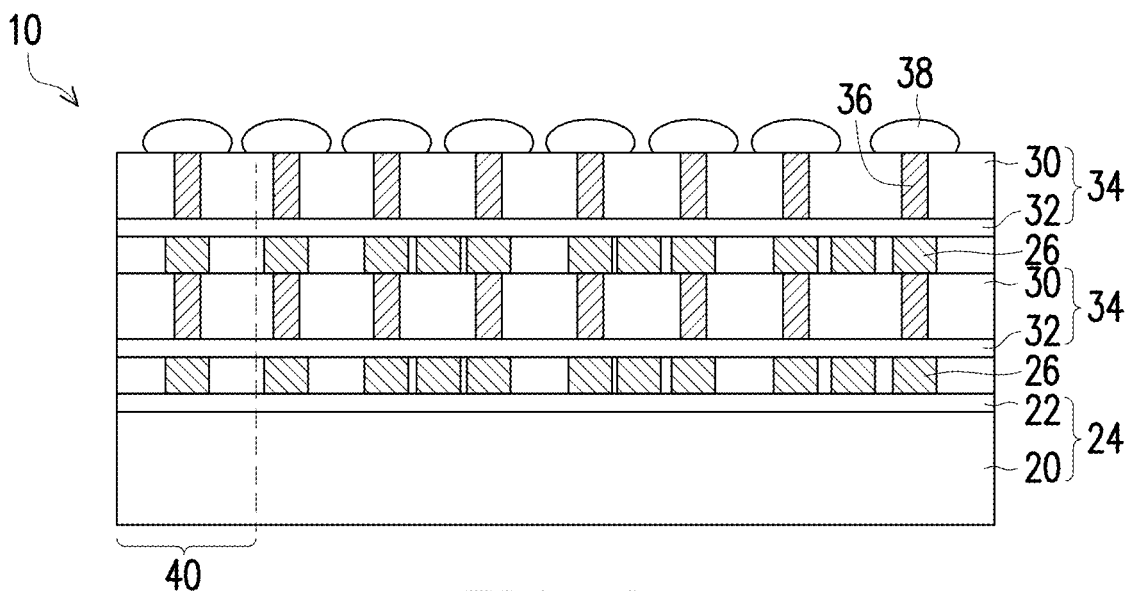
FIG. 2 is a drawing, schematically illustrating a cross-sectional stack structure of 3D semiconductor device with an interface, according to an embodiment of the invention.

FIG. 2 is a drawing, schematically illustrating a cross-sectional stack structure of 3D semiconductor device with an interface, according to an embodiment of the invention. Referring to FIG. 2, Based on the 3D package structure, in an embodiment, the 3D semiconductor device 10 may also include an interface region 40, where an interface in each circuit chip 24, 34 is formed at the interface region 40. The interface may link the circuit chip 24, serving as the master chip, to all of the circuit chips 34, which are serving as the slave chips. The communication between the circuit chip 24 and the circuit chips 34 may go through the interface at the interface region 40.

The circuit of the interface implemented within the interface region 40 would be described in detail later. As also noted, in an embodiment, multiple interface regions 40 as actually needed may be formed in the circuit chips, not limiting to single interface region.

Figure 3:
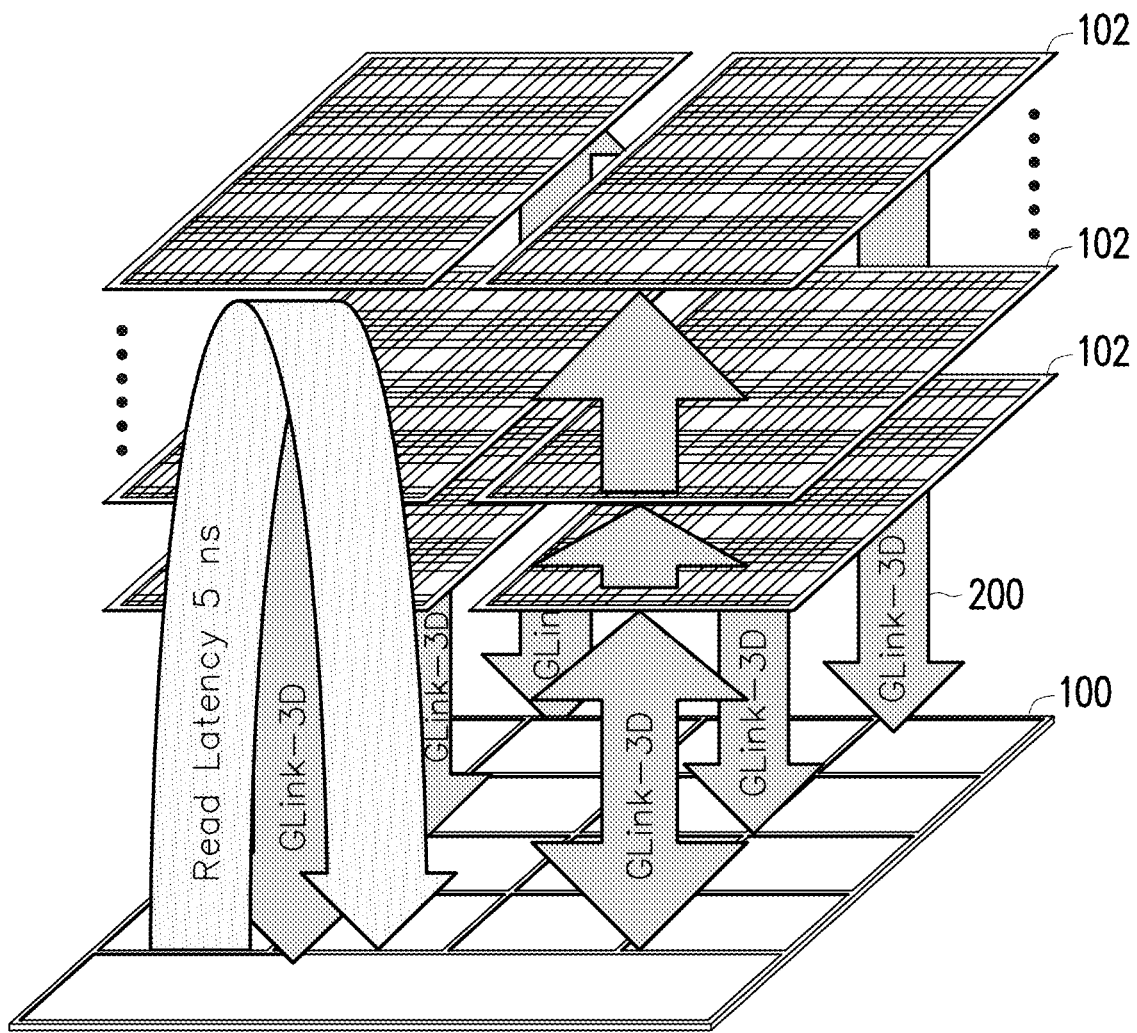
FIG. 3 is a drawing, schematically illustrating a perspective stack structure of 3D semiconductor device with the communication mechanism of the interface, according to an embodiment of the invention.

FIG. 3 is a drawing, schematically illustrating a perspective stack structure of 3D semiconductor device with the communication mechanism of the interface, according to an embodiment of the invention.

Referring to FIG. 3, as viewed in 3D stack structure in operation of the interface, a master chip 100, such as a processor chip, is included as a base chip in the semiconductor device. Multiple slave chips 102, such as SRAM chips, are stacked over the master chip 100. The master chip 100 includes a master interface and each slave chip includes a slave interface. The master interface and the slave interfaces form as an interface 200, which may also be referred as Glink-3D. The master chip 100 and the slave chips 102 are linked by the interface 200 to communication with the information/data/signal.

In an operation as an example, the master chip 100 of processor has a command to access the data stored the slave chips 102 of SRAM chips. Due to the interface as implemented, the read latency may be controlled to be about constant and small, such 2 ns or 5 ns in the examples. A single clock is used in the interface to distribute to all the slave chips, the path length from the master chip 100 to each slave ship 102 is about the same and reliable. The latency can be adjusted to be about constant as predictable.

Figure 4:
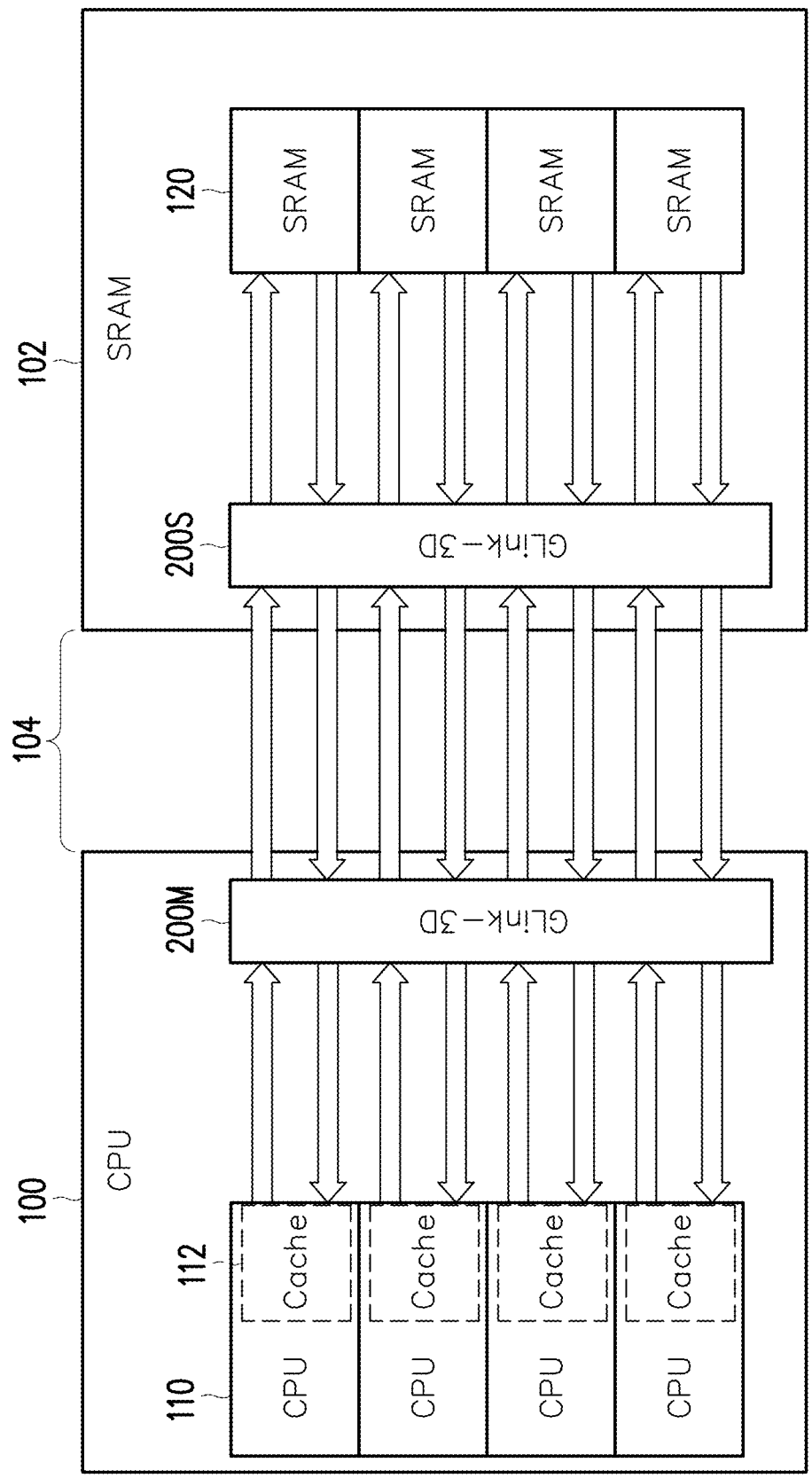
FIG. 4 is a drawing, schematically illustrating a communication mechanism of the interface between a master chip and a slave chip, according to an embodiment of the invention.

FIG. 4 is a drawing, schematically illustrating a communication mechanism of the interface between a master chip and a slave chip, according to an embodiment of the invention. Referring to FIG. 4, a communication mechanism between the master chip 100 with a master interface 200M and the slave chip 102 with a slave interface 200S through a bonding structure 104 in 3D package is described. The master interface 200M and the slave interface 200S form the interface 200 as stated in FIG. 3. Inside the master chip 100, the CPU blocks 110 with the cache blocks 112 in an example form a processor. The processor is connected to the master interface 200M to transmit or receive signals at the master interface 200M, as intended to communicate with the slave chip 102.

Inside of the slave chip 102, it also includes the SRAM blocks 120 and the slave interface 200S. The SRAM blocks 120 is connected to the slave interface 200S for communication with the master chip 100. IN communication the master interface 200M and the slave interface 200S are connected through the bonding structure 104. The bonding structure 104 may include the TSV with the hybrid bond pattern, depending on the packaging process. The connection is bi-way. The bond pattern may be corresponding to a data bus, generally. All signals are parallel transmitted or received. The clock rate may be 2.5 GHz in an example. The signal latency between the master chip 100 and the slave chip 102 through the interface of the master interface 200M and slave interface 200S is reliable and may be about 2 ns in one way as an example.

Figure 5:
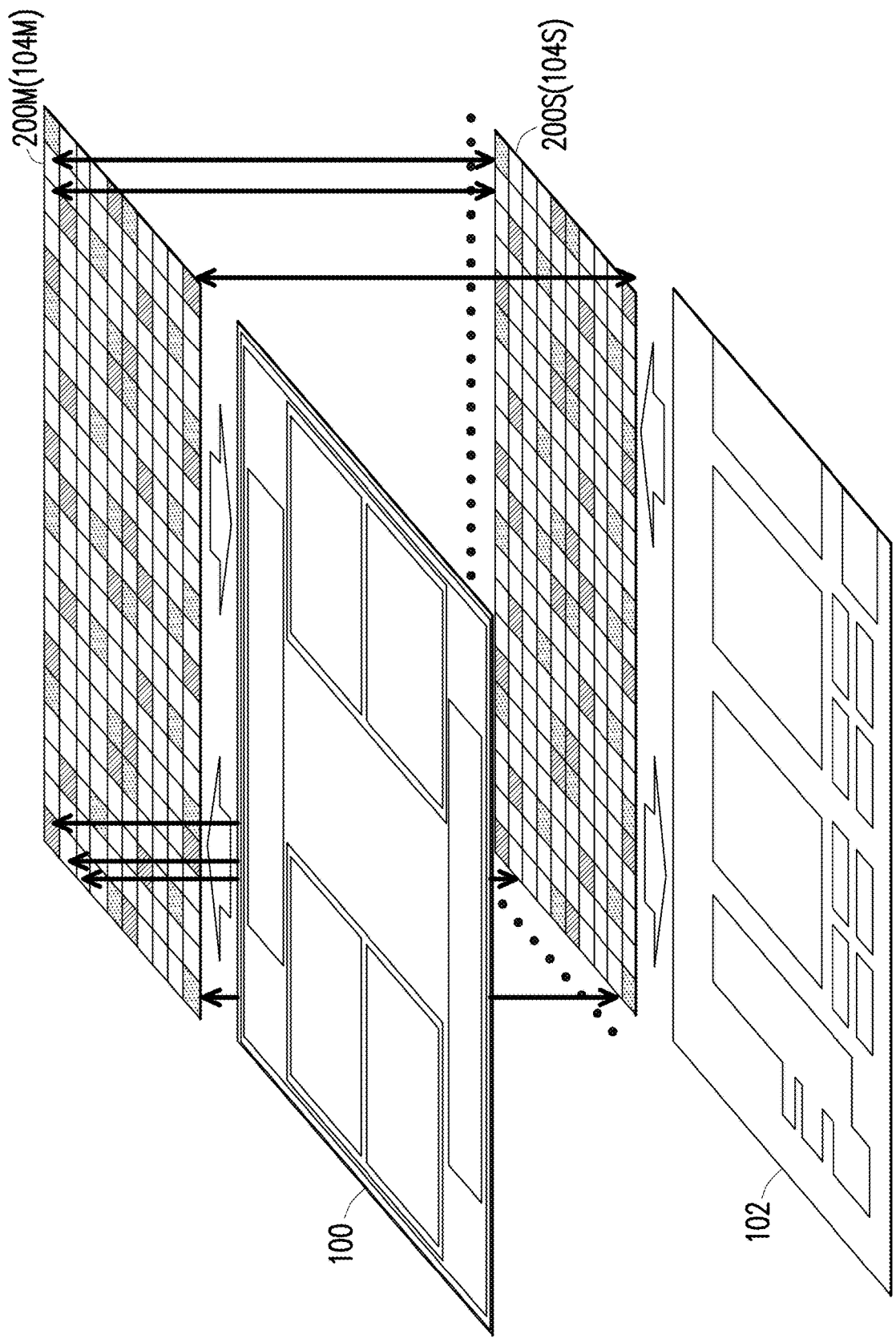
FIG. 5 is a drawing, schematically illustrating a 3D communication mechanism of the interface between a master chip and a slave chip, according to an embodiment of the invention.

FIG. 5 is a drawing, schematically illustrating a 3D communication mechanism of the interface between a master chip and a slave chip, according to an embodiment of the invention. Referring to FIG. 5, based on the operation mechanism as previously described, the master chip 100 and the slave chip 102 in 3D structure as an example is illustrated in better detail. The master chip 100, such as the processor, includes the master interface 200M, which including the bonding structure 104M. The bonding structure 104M in an example includes a bonds pattern, composed of a plurality of bonds in an example. As a result, depending on the data size of the bus, the bonds are formed as an array, in which one tile is corresponding to one group of binary data, such as 16-bit data with the power bond, clock bond, and other designated bonds. Multiple bond tiles form the whole bond pattern for the master interface 200M. As noted, the data from the processor is communicated in bi-direction with the master interface 200M.

Likewise, the slave chip 102 may include the SRAM and the slave interface 200S. The SRAM communicates with the slave interface 200S, and the slave interface 200S communicates with the master interface 200M through the connection of the bonding structure 104S, which is also composed of a plurality of bonds, each represented by one square unit, arranged in an array manner as a bond pattern. Likewise, the bond pattern is also divided into multiple tiles. In the 3D packaging technology, the master interface 200M and the slave interface 200S are connected through the bonding structure 104M and the bonding structure 104S with the matched bond patterns. As a result, the master interface 200M and slave interface 200S are connected as a complete interface, based on the 3D packaging technology, to have communication between the master chip 100 and slave chip 102. As noted, multiple slave chips 102 are stacked on top of the master chip 100, in which the master interface 200M and the slave interfaces 200S are connected together in vertical direction.

Figure 6:
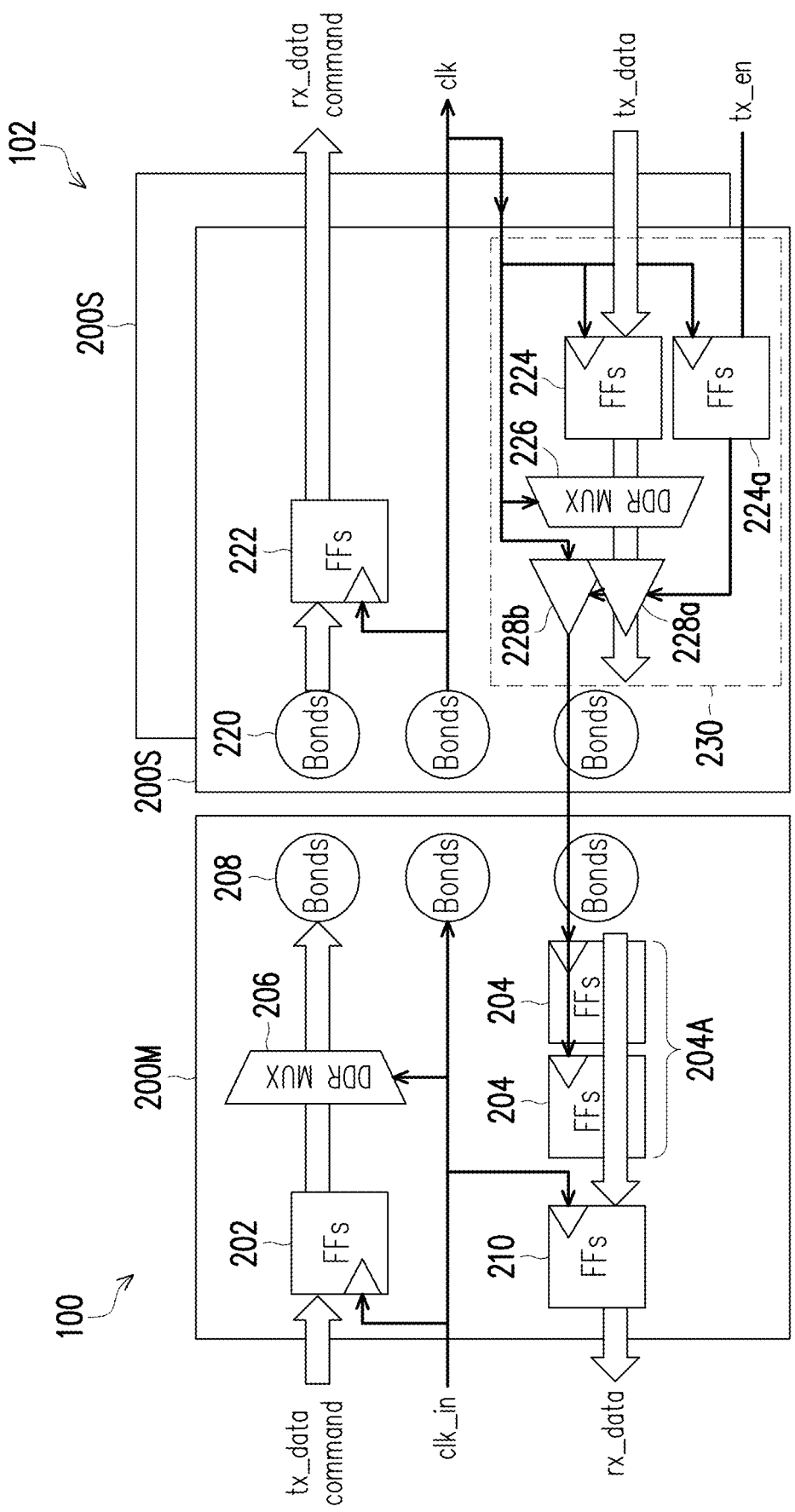
FIG. 6 is a drawing, schematically illustrating a circuit structure of the interface between a master chip and a slave chip, according to an embodiment of the invention.

The circuit for the master interface 200M and the slave interface 200S are described as follows. FIG. 6 is a drawing, schematically illustrating a circuit structure of the interface between a master chip and a slave chip, according to an embodiment of the invention.

Referring to FIG. 6, the master interface 200M of a master chip 100 and the slave interface 200S of a slave chip 102 are described with the circuit as implemented. As to the master interface 200M, it includes a flip-flop (FF) block 202 to receive a command as intended by the core circuit of the master chip 100. The command in an example as an input may include a cluster of data tx_data and/or command without specific limitation. The number of the flip-flop block 202 may be one unit (FF) or more unit (FFs) as actually need without limitation here. The command from the master chip 100 in an example may include command and the data cluster to be transmitted. The command may also include a selecting slave identification, which is used to select the slave chip 102 to perform the command from the master chip 100.

A multiplexer 206 receives the output of the flip-flop block 202. The multiplexer 206 in an example is a double data rate (DDR) type in accordance with the input data at the flip-flop block 202. The output of the multiplexer 206 is transmitted to the corresponding bonds of a bond pattern 208 in the master interface 200M.

As noted, the single clock, clk, is provided through the master interface 200M and the slave interface 200S into the slave chip 102. The flip-flop block 202 and the multiplexer 206 are controlled in timing by the clock clk_in. In the master interface 200M, the flip-flop block 202 and the master multiplexer 206 form a transmitting path, so to transmit command to the slave chip 102.

The master interface 200M also includes a receiving path to receive the response from the slave chip 102 through the slave interface 200S and the master interface 200M with the corresponding bond portion of the bond pattern 208. A first-in-first-out (FIFO) block 204A receives the response from the slave interface 200S. The FIFO block 204A in an example include multiple flip-flop units 204. The output of the FIFO block 204A is provided to another flip-flop block 210 and then inwardly transmitted into the core of the master chip 100. The flip-flop block 210 is controlled in timing by the clock clk_in. The FIFO block 204A is controlled by the feedback clock from the slave chip 102 with an enable control corresponding to the response data from the slave chip 102.

In an example of read operation, the command of the master chip 100 is received by the flip-flop block 202 of the master interface 200M. The slave chip 102 as selected responds the data as requested to the FIFO block 204A of the master interface 200M.

In the slave interface 200S of the chip 102, the bond pattern 220 is corresponding to the bond pattern 208. The command of the master chip 100 is then received by a flip-flop block 222, which is also control the clock clk. The flip-flop block 222 in the slave interface 200S then further transmit the command, such as rx_data and/or command, inward to the SRAM of the slave chip 102. In an example, the master chip 100 sends a command to read data from the SRAM of the slave chip 102.

Then, the slave chip 102 provides the data cluster as requested from the master chip 100, also indicated by tx_data to the slave chip 102 in an example, into the circuit bock 230. The circuit block 230 is also controlled by the clock clk and an enable signal, tx_en. The circuit block 230 includes a flip-flop block 224, an enable flip-flop block 224a, a slave multiplexer 226, and an output control block 228a, 228b.

The clock signal clk in each slave interface 200S for control is also provided to the third flip-flop block 222, the fourth flip-flop block 224, the slave multiplexer 226, the enable flip-flop block 224a, and the output control block 228b.

The flip-flop block 224 outputs the data to the slave multiplexer 226 and then the output control block 228a. The enable flip-flop block 224a receives an enable signal tx_en and the clock signal clk and provides a control signal to control the output control block 228a. Then the data as provided by the slave chip 102 is transmitted to the master chip 100 through a bond portion of the bond pattern 220.

To have the proper timing control of the clock signal clk to respond to the master chip 100, another output control block 228b also receives the original clock clk and control by the enable signal from the enable flip-flop block 224a.

The data output from the slave interface 200S is then received by the FIFO bock 204A in the master interface 200M. To the master interface 200M, the data rx_data are the response from the slave chip 102 with respect to the command, such as command.

In an embodiment, there are a number of the slave chips 102 stacked over the master chip 100. The command from the master chip 100 is sent to all of the slave chips 102. In this situation, the command of the master chip 100 also includes a selecting slave identification, which is used to select the slave chip 102 to perform the command from the master chip 100. The slave interface 200S also include the capability to recognize the selecting slave identification code. Each of the slave interface 200S has its own identification code. The one of the slave interface 200S matching to the selecting slave identification code would be activated to respond the command from the master chip 100 at the time slot allocated by the master command. The interference between the slave chips may be effectively avoided.

Figure 7:
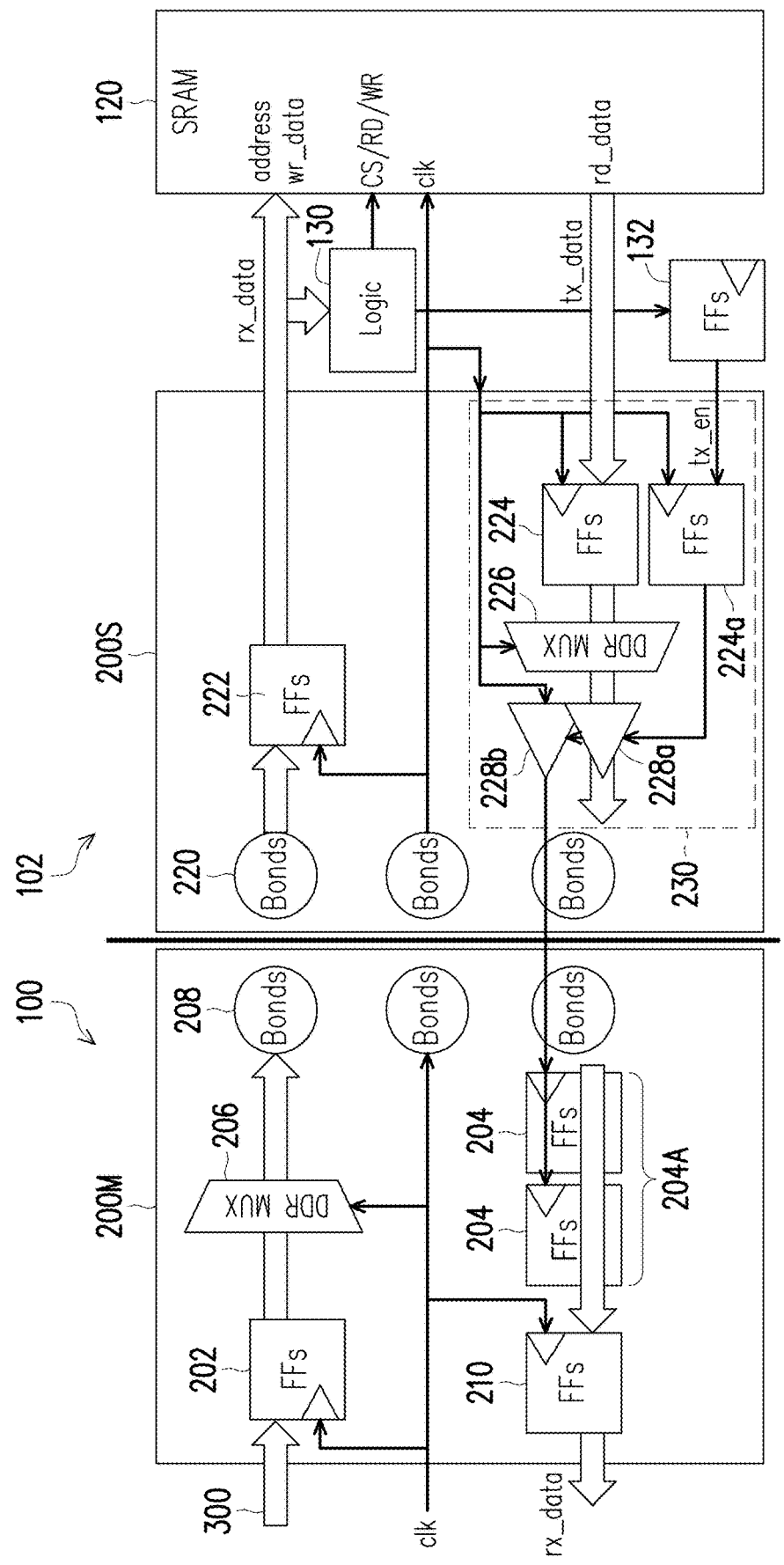
FIG. 7 is a drawing, schematically illustrating a circuit structure of the interface between a master chip and a slave chip, further according to an embodiment of the invention.

FIG. 7 is a drawing, schematically illustrating a circuit structure of the interface between a master chip and a slave chip, further according to an embodiment of the invention. Referring to FIG. 7, the connection between the slave interface 200S and the SRAM 120 in an example is further described.

The command 300 may include command, address, write data and the selecting slave identification, in an example. The data rx_data from the flip-flop block 222 of the slave interface 200S is output to the SRAM 120. However, the slave interface 200S may further include a logic circuit 130 and a fifth flip-flop block 132. The logic circuit 130 also receives the command, such as the data rx_data, outputting from the third flip-flop block 222 to determine a type signal of command/read_data/write_data (CS/RD/WR) and also produce a preliminary enable signal to the fifth flip-flop block 132, the fifth flip-flop block 132 accordingly output the enable signal to the enable flip-flop block 224a. The SRAM 120 receives the type signal of CS/RD/WR to respond the command from the master chip 100. Once the slave chip 102, such as the SRAM 120 finishes the command, a result such as the data rd_data for reading command is responded to the slave interface 200S as the input data tx_data for the slave interface 200S.

As further noted, in the structure of the invention including the interface in connecting to multiple slave chips 102, such as 16 slave chips, the write command and the read command may be overlapping and then executed simultaneously. The size of the data bus may have 256 bits in addition with some reserved bits. The bond pattern 208 and 220 have the number of bonds to transmit the data signals by multiple bond tiles as shown in FIG. 5.

Figure 8:
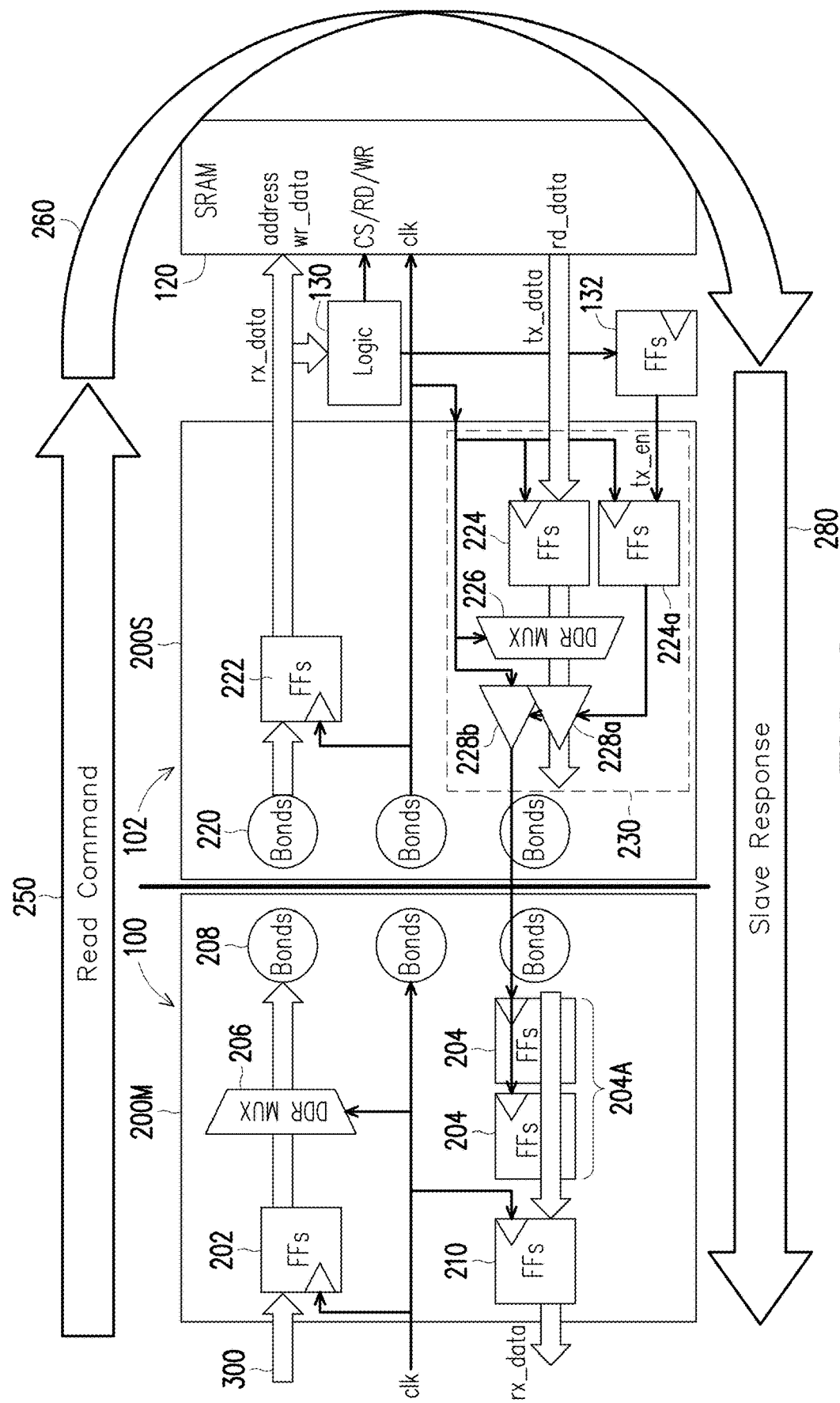
FIG. 8 is a drawing, schematically illustrating a read cycle of the interface between a master chip and a slave chip, further according to an embodiment of the invention.

FIG. 8 is a drawing, schematically illustrating a read cycle of the interface between a master chip and a slave chip, further according to an embodiment of the invention. Referring to FIG. 8, it takes a read command from the master chip 100 as an example for descriptions.

The read command 250 as the command 300 from the core circuit of the mater chip 100 is input to the flip-flop block 202 of the master interface 200M. The single clock clk_in is also input the master interface 200M to control the flip-flop block 202 and the master multiplexer 206. The command is sent to the corresponding bond portion of the bond pattern 208. The bond pattern 208 is one-to-one connected to the bond pattern 220 of the slave interface 200S. As also previously described, the command enters the SRAM 120 of the master chip 102 to read data at the address in the command 300. After the read operation in the SRAM 120, the read data rd_data are obtained to be sent back to the circuit block 230 of the slave interface 200S. The logic circuit 130 and the flip-flop 132 determine the time slot, so that the read data rd_data as responding to the command 300 are sent to the mater interface 200M for outputting as the data rx_data at the flip-flop block 210. The data rx_data in an example are the result, as requested by the master chip 100.

Further noted, the single clock clk is used in the whole read operation. The data latency may be reliably adjusted to have a predictable constant.

Figure 9:
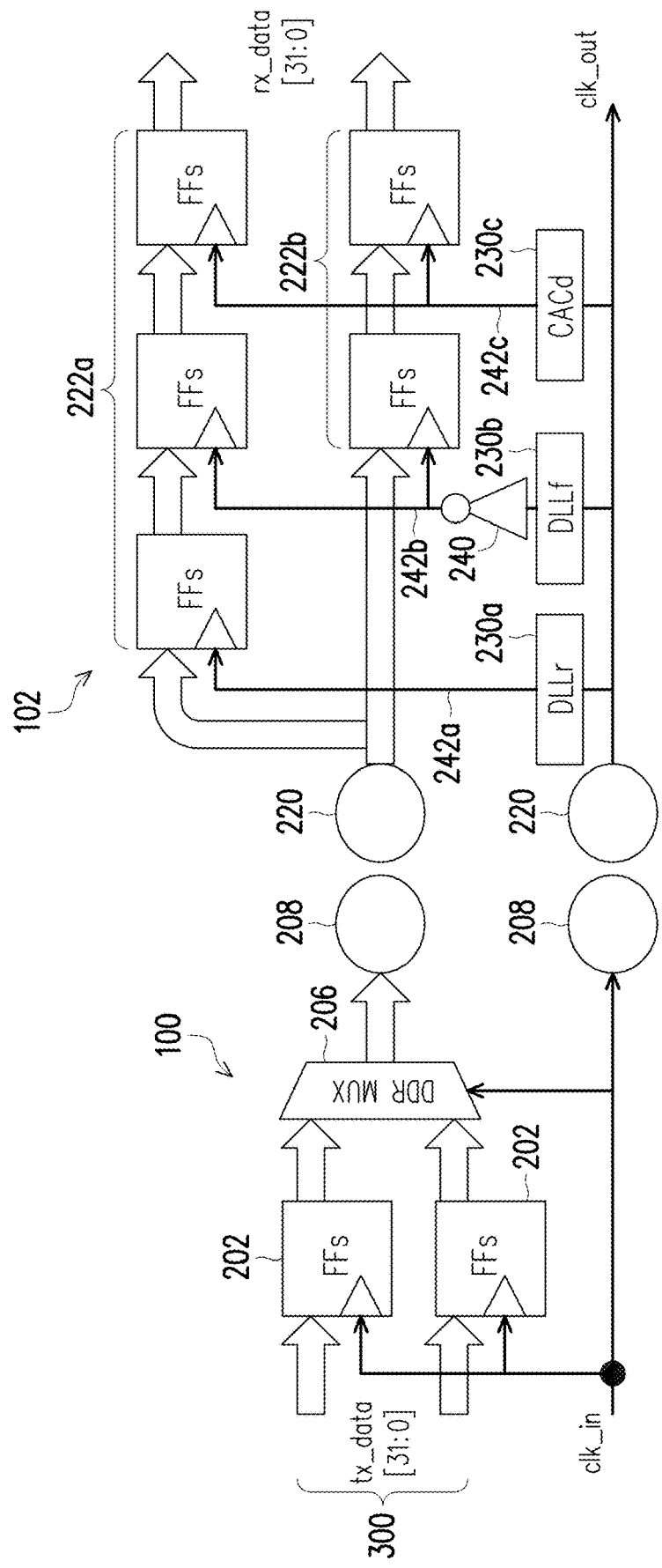
FIG. 9 is a drawing, schematically illustrating a circuit structure of the interface between a master chip and a slave chip based on the DDR manner, according to an embodiment of the invention.

To speed up the data transmission, the double data rate (DDR) mechanism may be also involved. The clock frequency may be 2.5 GHz in an example. The DDR mechanism allows the data be transmitted in rate of 5 GHz, in which the rising edge and the falling edge of the clock pulse are all providing as a trigger edge. FIG. 9 is a drawing, schematically illustrating a circuit structure of the interface between a master chip and a slave chip based on the DDR manner, according to an embodiment of the invention.

Referring to FIG. 9, for one command 300 from the master chip 100, the data tx_data as the command 300 in an example may include 32-bit data. It adapts the DDR mechanism, the 32-bit may be divided into two set of 16-bit data, which are respectively input to the flip-flop block 202. The master multiplexer 206 is operated under the DDR mechanism as well. After the command 300 is transmitted to the slave chip 102, the two part of the data are respectively entering the flip-flop block 222a and the flip-flop block 222b in two paths. The flip-flop block 222a and the flip-flop block 222b are corresponding to the flip-flop block 222 in FIG. 6. The clock clk also control the flip-flop block 222a and the flip-flop block 222b.

However, to properly decode the data cluster, that is also referred to a data eye as presented in drawing, several delay lock loop (DLL) blocks, such as DLLr 230a and DLLf 230b as indicated. In addition, a delay control unit 230c as indicated by CACd 230c is also used to modify the clock clk to control the flip-flop blocks 222a, 222b. Then, the bits in the data cluster are decoded correctly. Due to the DDR mechanism, an inverter 240 is used to invert the voltage level at the DLLf 230b, before providing to the flip-flop blocks 222a, 222b. The DDR bus then provides the data rx_data in the slave interface 200S of the slave chip 102.

Figure 10:
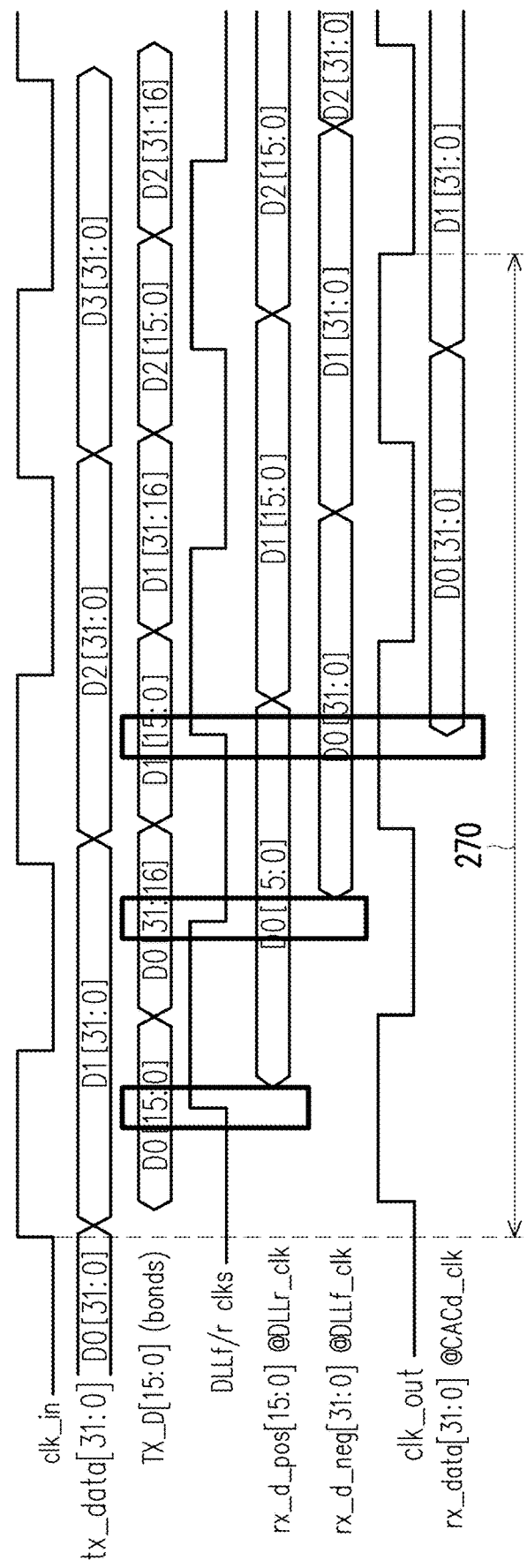
FIG. 10 is a drawing, schematically illustrating signal forms for various signals involved in the interface, according to an embodiment of the invention.

FIG. 10 is a drawing, schematically illustrating signal forms for various signals involved in the interface, according to an embodiment of the invention. Referring to FIG. 9 and FIG. 10, the timing of the data signal with respect to the single clock, clk_in are illustrated.

The clock clk_in in an example is 2.5 GHz. Based on the DDR bus to transmit data, the 32-bit data tx_data [31:0] are divided into two 16-bit data clusters as D0[15:0] and D0[31:16] at the bonds. Each data cluster of 16-bit as presented in shape may also be called as a data eye. The adjusted clocks from the DLLf 230a and DLLf 230b has rising edge and the falling edge at the about the middle of one data eye, as also indicated the bars.

The location in timing of the rising edge and the falling edge with respect to the data eye may be looked for at the initial stage, basically is located at the middle of the data eye to assure the data in the data cluster can be correctly sensed out. Once the size of data eye is shifted by environmental condition, such as temperature or voltage variation, the location of the trigger edge is proportionally adjusted according to the size change of the data eye under monitoring. The trigger edges also cause the data to enter the slave interface 102 in two paths. The output clock clk_out has the same form as the input clock clk_in but slightly delayed due to the traveling path from the master interface 200M to the slave interface 200S. Then the data rx_data [31:0] as indicated by D0[31:0] at the clock CACd_clk is output from the slave interface. The latency 270 may be reliably set to 2 periods plus the slight delay for the output clock clk_out.

Figure 11:
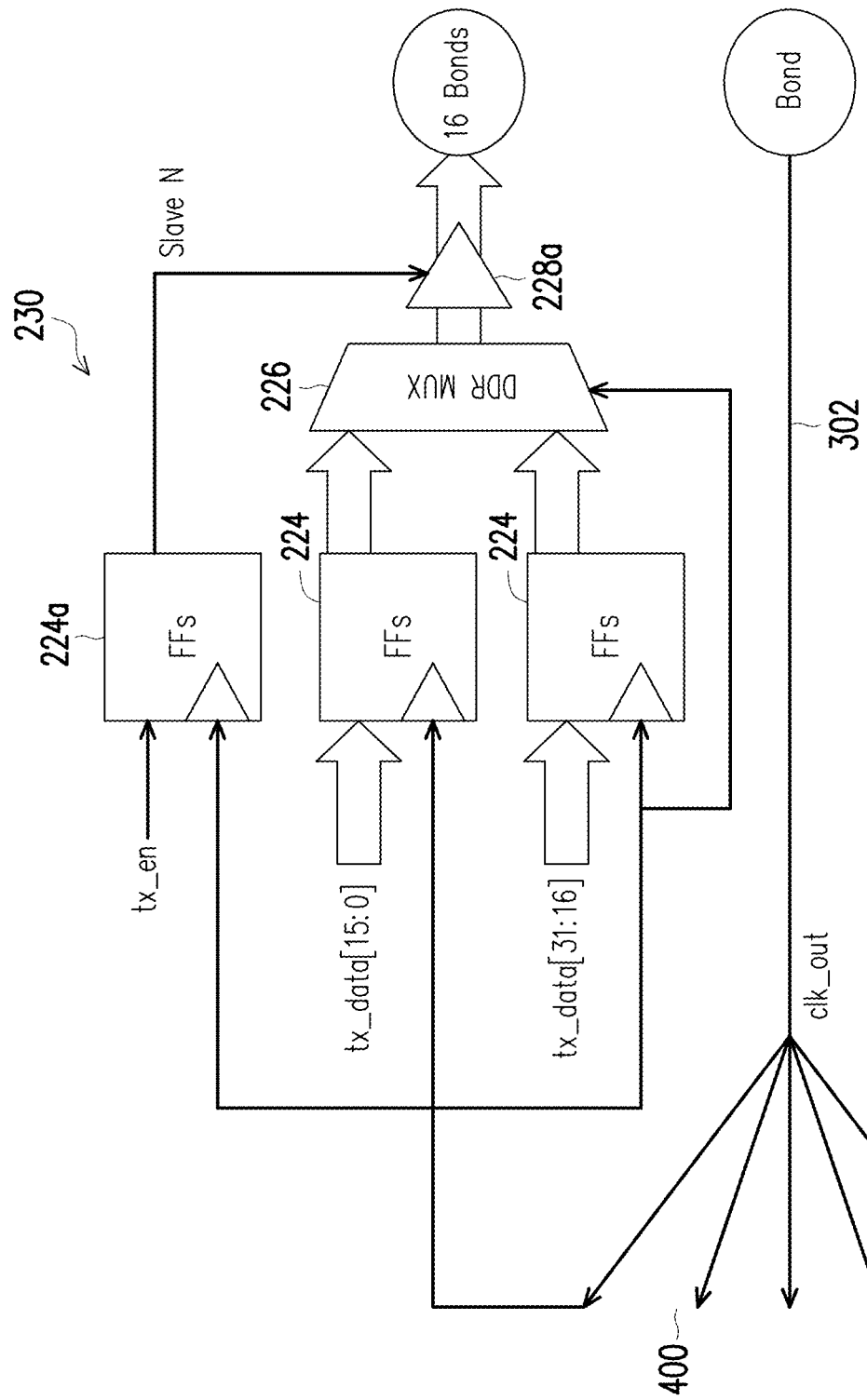
FIG. 11 is a drawing, schematically illustrating a partial circuit of the slave interface with the mechanism of clock tree, according to an embodiment of the invention.

FIG. 11 is a drawing, schematically illustrating a partial circuit of the slave interface with the mechanism of clock tree, according to an embodiment of the invention. To provide the clock to multiple slave chips, the single input clock clk_in may use the clock tree to distribute the clock to the next slave interface one after one.

Referring to FIG. 8 and FIG. 11 as an example, the circuit block 230 in the slave interface 200S need also to receive the output clock clk, also referred to clk_out, to the SRAM 120. Then, a clock tree 400 mechanism would branch the single clock clk_out 302 into multiple branches, respectively corresponding to the multiple slave interfaces 200S. Then, each slave interface 200S has the same operation mechanism as previously described. The circuit block 230 in FIG. 6 may be further modified with the clock tree 400 mechanism, here. As a result, one master chip 100 may be efficiently and identically connected to multiple slave chips 102 based on the 3D packaging technology.

Figure 12:
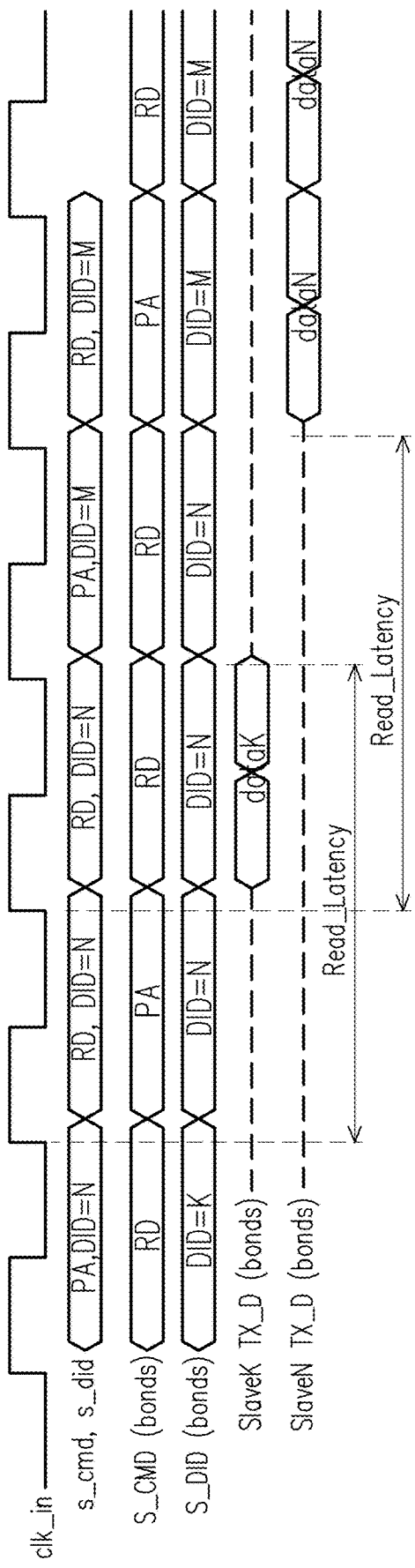
FIG. 12 is a drawing, schematically illustrating signal forms for various signals involved in the interface based on the DDR manner, according to an embodiment of the invention.

FIG. 12 is a drawing, schematically illustrating signal forms for various signals involved in the interface based on the DDR manner, according to an embodiment of the invention. Referring to FIG. 12, a read latency is taken as an example for description. Based on the circuit structure in FIG. 11 to operate multiple slave chips, the related signals in timing relation are described.

The clock signal clk_in is referring to the original clock enter the master interface. The master chip schedules the command PA and command RD with the slave_identification (ID) signal DID for the slave chip. Then the command signals S_CMD and S_DID are decoded and send to the bonds of the master interface. Here in an example, the command RD is indicating a read operation and the command PA is referring to the preamble information for which slave should prepare the sending data while the command s_did [3:0] in an example defines which slave device should send data then would take over data bus to prepare to send data. The slave interface based on the clock tree and the identification code DID to get the clock and command to read data at the SRAM 120. In operation, the master chip has to schedule the command PA when it changes from one DID to another DID. The data tx_data from the slave chip K and the data tx_data from the slave chips N, has one cycle delay. However, the control mechanism with commands and action is depending on the actual need. The invention is not necessary to be limited to the specific example in operation. However, the interface provides the transmission of commands and data between the master device and the slave device by a reliable and efficient way.

In an example of read operation, the master chip also needs to send a command NOP if 2 or more turnaround cycles are required. As a result, the multiple slave chips in read operation needs about 2 cycles, referred as the read latency. The read latency is reliable and constant for each slave chip.

Figure 13:
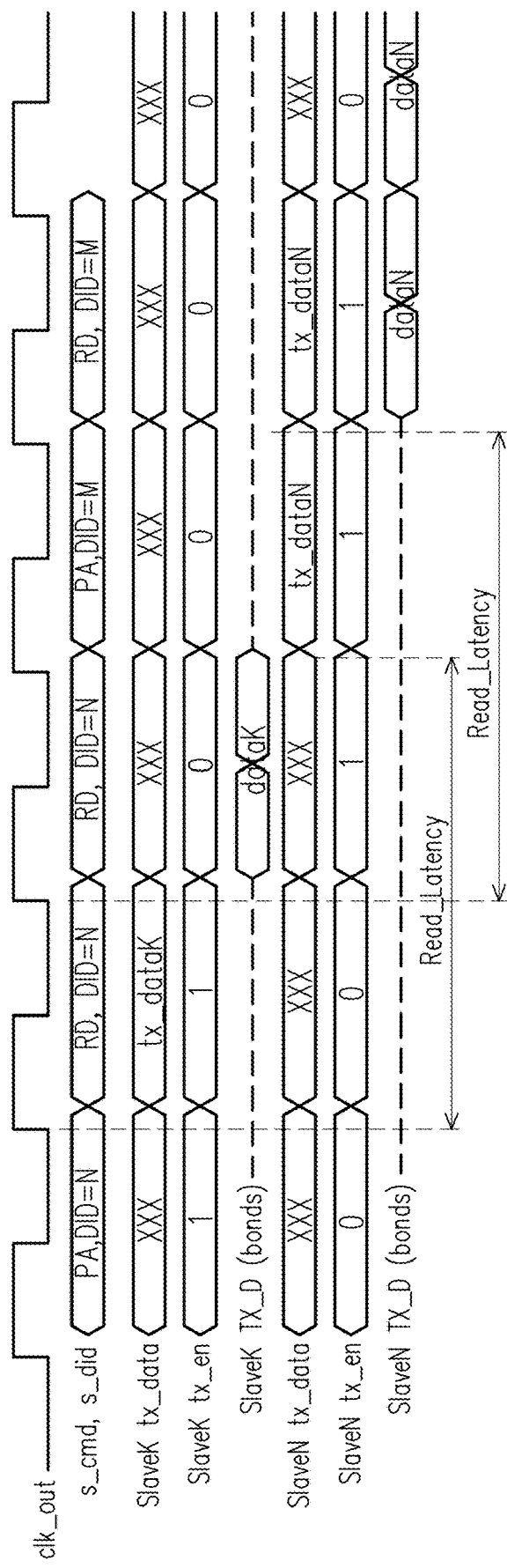
FIG. 13 is a drawing, schematically illustrating signal forms for various signals involved in the interface, according to an embodiment of the invention.

FIG. 13 is a drawing, schematically illustrating signal forms for various signals involved in the interface, according to an embodiment of the invention. Referring to FIG. 13, the operation for multiple slave chips in operation between input and output, the output of the slave chip as selected needs to be controlled at the time slot by the enable signal tx_en, as shown in FIG. 7 and FIG. 8. The output clock clk_out in the slave chip 200S is used to control the flip-flop blocks for receiving data tx_data and then outputting the data. The signal of command s_cmd and slave identification s_did in master chip are also shown for reference.

The enable signal tx_en may assure the data from the selected one of the slave chips at the time slot to respond the data without interference with other slave chips, based on the clock tree mechanism. The enable signal tx_en in an embodiment starts one clock before the selected slave chip drives the input data tx_data.

In an embodiment, the slave chip N and the slave chip K as two for looking into about the read latency. The enable signal tx_en starts driving at read_latency clocks, clks, after the signals at the condition of s_cmd=PA and s_did=slave_ID. The enable signal tx_en would be asserted when s_cmd=(PA or RD) and s_did=slave_ID. As estimated, the read latency is estimated as about two cycles for each slave chip.

In other words, the single clock clk from the master chip 100 may be distributed to all of the slave chips as stacked. The slave ID is recognized by the corresponding slave chip, and the enable signal tx_en is accordingly induced to control the output at the bonds of the bond pattern. The read latency for each slave ship may be controlled to be substantially constant. In addition, the delay lock loops are involved to assure the bit data of the data eye be correctly sensed out.

The signals based on the interface may be transmitted at the reliable condition. Then the interface may be fabricated in accordance with the 3D packaging technology. As a result, the 3D semiconductor device including the interface are formed in rather compact structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An interface for a semiconductor device, the semiconductor device including a master device and a plurality of slave devices, wherein the master device and the slave devices are stacked up with electric connection, the interface comprising:
 a master interface, implemented in the master device and including a master interface circuit with a master bond pattern;
 a slave interface, implemented in each of the slave devices and including a slave interface circuit with a slave bond pattern to correspondingly connect to the master bond pattern; and
 a clock route, to transmit a clock signal through the master interface and the slave interface,
 wherein the master device transmits a command and a selecting slave identification through the master interface to all the slave interfaces;
 wherein one of the slave devices corresponding to the selecting slave identification executes the command and responds a result back to the master device through the slave interfaces and the master interface.

2. The interface as recited in claim 1, wherein the command from the master device is transmitted based on a double data rate (DDR) mechanism and a master multiplexer combines the command, wherein a flip-flop block in the slave interface circuit converts the command from the master device from the DDR form to a command form as internally used in the slave device.

3. The interface as recited in claim 1, wherein the master device includes a processor and the slave device includes a memory device.

4. The interface as recited in claim 1, wherein the master interface and the slave interface are connected together by a three-dimensional stack at least through the master bond pattern and the slave bond pattern, wherein a plurality of through-silicon vias are included for connecting the master bond pattern and the slave bond pattern.

5. The interface as recited in claim 1, wherein the master interface circuit comprises:
 a master transmitting path, including a first flip-flop block and a master multiplexer connected in series, wherein the first flip-flop block receives the command and the master multiplexer outputs the command to the slave devices through a first part of the master bond pattern;
 a master receiving path, including a first-in-first-out block and a second flip-flop block connected in series, wherein the first-in-first-out block is connected to a second part of the master bond pattern to receive the result from the slave device and the second flip-flop block outputs the result to the master device; and a first part clock route, connected to a third part of the master bond pattern to receive the clock signal and transmit the clock signal to the slave interfaces, wherein the clock signal in the master interface for control is also provided to the first flip-flop block, the second flip-flop block and the master multiplexer.

6. The interface as recited in claim 5, wherein the slave interface circuit in each slave device comprises:

a third flip-flop block, connected to a first part of the slave bond pattern to transmit the command to the slave device;

a circuit block, including:
  a fourth flip-flop block, to receive the result from the slave device;
  a slave multiplexer, receiving the result from the fourth flip-flop block;
  an output control block, connected between the slave multiplexer and the second part of the slave bond pattern to pass the result from the fourth flip-flop block to the master device interface under control by an enable signal; and
  an enable flip-flop block, to receive the enable signal and control the output control block; and a second part clock route, connected to a third part of the slave bond pattern to transmit the clock signal to the slave device, wherein the clock signal in each slave interface for control is also provided to the third flip-flop block, the fourth flip-flop block, the slave multiplexer, the enable flip-flop block, and the output control block.

7. The interface as recited in claim 6, wherein the clock signal in each slave interface is received from one branch of a clock tree, the clock tree transmits the clock signal as a single signal used in the master device and the slave device.

8. The interface as recited in claim 6, wherein the slave interface further comprising:
  a logic circuit; and
  a fifth flip-flop block,
  wherein the logic circuit also receives the command outputting from the third flip-flop block to determine a signal to the fifth flip-flop block, the fifth flip-flop block accordingly output the enable signal to the enable flip-flop block.

9. The interface as recited in claim 6, wherein the command from the master device is folded into two command parts as two data eyes and the first flip-flop block in the master interface circuit comprises a pair of flip-flop units to respectively receive the two command parts and two command parts are combined by the master multiplexer in a double rate data (DDR) structure.

10. The interface as recited in claim 9,
wherein the slave interface circuit further comprises a first delay-locked loop (DLL), a second DDL with an inverter and a delay control unit respectively receive the clock signal and output a first signal, a second signal and a third signal,
wherein the third flip-flop block comprises:
a first path, having the three flip-flop units connected in series and respectively receiving the first signal, the second signal and the third signal; and
a second path, having two flip-flop units connected in series and respectively receiving the second signal and the third signal, wherein the first signal and the second signal provide trigger edges to the correspondingly-connected flip-flop units,
wherein the third signal triggers a timing of the correspondingly-connected flip-flop units to output the two command parts of the command to the slave device.

11. The interface as recited in claim 10, the first DLL and the second DDL adjust timings of the rising edge and the falling edge to be located at an optimized time point with respect to the data eyes of the command.

12. An interfacing method for a semiconductor device, the semiconductor device including a master device and a plurality of slave devices, wherein the master device and the slave devices are stacked up with electric connection, the interfacing method comprising:
implementing a master interface in the master device, the master interface including a master interface circuit with a master bond pattern;
implementing a slave interface in each of the slave devices, the slave interface including a slave interface circuit with a slave bond pattern to correspondingly connect to the master bond pattern; and
implementing a clock route, to transmit a clock signal through the master interface and the slave interface,
wherein the master device transmits a command and a selecting slave identification through the master interface to all the slave interfaces;
wherein one of the slave devices corresponding to the selecting slave identification executes the command and responds a result back to the master device through the slave interfaces and the master interface.

13. The interfacing method as recited in claim 12, wherein the command from the master device is transmitted based on a double data rate (DDR) mechanism and the master multiplexer combines the command, wherein a flip-flop block in the slave interface circuit converts the command from the master device from the DDR form a command form as internally used in the slave device.

14. The interfacing method as recited in claim 12, wherein the master device as implemented includes a processor and the slave device includes a memory device.

15. The interfacing method as recited in claim 12, wherein the master interface and the slave interface are connected together by a three-dimensional stack at least through the master bond pattern and the slave bond pattern, wherein a plurality of through-silicon vias are included for connecting the master bond pattern and the slave bond pattern.

16. The interfacing method as recited in claim 12, wherein the master interface circuit as implemented comprises:
implementing a master transmitting path, including a first flip-flop block and a master multiplexer connected in series, wherein the first flip-flop block receives the command and the master multiplexer outputs the command to the slave devices through a first part of the master bond pattern;
implementing a master receiving path, including a first-in-first-out block and a second flip-flop block connected in series, wherein the first-in-first-out block is connected to a second part of the master bond pattern to receive the result from the slave device and the second flip-flop block outputs the result to the master device; and
implementing a first part clock route, connected to a third part of the master bond pattern to receive the clock signal and transmit the clock signal to the slave interfaces, wherein the clock signal in the master interface for control is also provided to the first flip-flop block, the second flip-flop block and the master multiplexer.

17. The interfacing method as recited in claim 16, wherein the slave interface circuit as implemented in each slave device comprises:
   implementing a third flip-flop block, connected to a first part of the slave bond pattern to transmit the command to the slave device;
   implementing a circuit block, including:
      a fourth flip-flop block, to receive the result from the slave device;
      a slave multiplexer, receiving the result from the fourth flip-flop block;
      an output control block, connected between the slave multiplexer and the second part of the slave bond pattern to pass the result from the fourth flip-flop block to the master device interface under control by an enable signal; and
      an enable flip-flop block, to receive the enable signal and control the output control block; and
   implementing a second part clock route, connected to a third part of the slave bond pattern to transmit the clock signal to the slave device,
   wherein the clock signal in each slave interface for control is also provided to the third flip-flop block, the fourth flip-flop block, the slave multiplexer, the enable flip-flop block and the output control block.

18. The interfacing method as recited in claim 17, wherein the clock signal in each slave interface is received from one branch of a clock tree, the clock tree transmits the clock signal as a single signal used in the master device and the slave device.

19. The interfacing method as recited in claim 17, wherein the slave interface is further implemented, comprising:
   implementing a logic circuit; and
   implementing a fifth flip-flop block,
   wherein the logic circuit also receives the command outputting from the third flip-flop block to determine a signal to the fifth flip-flop block, the fifth flip-flop block accordingly output the enable signal to the enable flip-flop block.

20. The interfacing method as recited in claim 17, wherein the command from the master device is folded into two command parts as two data eyes and the first flip-flop block in the master interface circuit comprises a pair of flip-flop units to respectively receive the two command parts and two command parts are combined by the master multiplexer in a double rate data (DDR) structure.

21. The interfacing as recited in claim 20,
   wherein the slave interface circuit further comprises a first delay-locked loop (DLL), a second DDL with an inverter and a delay control unit respectively receive the clock signal and output a first signal, a second signal and a third signal,
   wherein the third flip-flop block as implemented comprises:
   implementing a first path, having the three flip-flop units connected in series and respectively receiving the first signal, the second signal and the third signal; and
   implement a second path, having two flip-flop units connected in series and respectively receiving the second signal and the third signal,
   wherein the first signal and the second signal provide trigger edges to the correspondingly-connected flip-flop units,
   wherein the third signal triggers a timing of the correspondingly-connected flip-flop units to output the two command parts of the command to the slave device.

22. The interfacing method as recited in claim 21, the first DLL and the second DDL adjust timings of the rising edge and the falling edge to be located at an optimized time point with respect to the data eyes of the command.

* * * * *